United States Patent [19]
Hartsell et al.

[11] 3,946,421
[45] Mar. 23, 1976

[54] MULTI PHASE DOUBLE LEVEL METAL CHARGE COUPLED DEVICE

[75] Inventors: Glenn A. Hartsell; Allan R. Kmetz, both of Dallas, Tex.

[73] Assignee: Texas Instruments Incorporated, Dallas, Tex.

[22] Filed: June 28, 1974

[21] Appl. No.: 484,359

[52] U.S. Cl. ................ 357/24; 29/589; 307/221 D; 307/304; 357/68; 357/71
[51] Int. Cl.² .................... H01L 27/10; G08C 15/08
[58] Field of Search ...... 357/24, 68, 71; 307/221 C, 307/221 D, 304

[56] References Cited
UNITED STATES PATENTS

| | | | |
|---|---|---|---|
| 3,756,924 | 9/1973 | Collins et al. | 357/24 |
| 3,760,202 | 9/1973 | Kosonocky | 357/24 |
| 3,795,847 | 3/1974 | Engeler et al. | 357/24 |

OTHER PUBLICATIONS

Garner, Ed., "State-of-Solid-State," Radio-Electronics, Aug. 1973, pp. 56-57.

*Primary Examiner*—William D. Larkins
*Attorney, Agent, or Firm*—Harold Levine; James T. Comfort; Richard L. Donaldson

[57] ABSTRACT

Adjacent CCD phase electrodes in different levels separated by an insulating layer are connected to multi level phase buses on one side of the phase electrode by secondary bus means extending from one electrode in one level to an electrode of the same phase spaced therefrom in a different level by way of a vias through the insulation layer at a location intermediate the buses and the phase electrodes.

14 Claims, 5 Drawing Figures

MULTI PHASE DOUBLE LEVEL METAL CHARGE COUPLED DEVICE

This invention relates to the construction of a charge coupled device with particular reference to a three phase device in which double level metal is employed to apply clock pulses from buses all located on one side of the set of phase electrodes.

The invention is generally related to a serial CCD register wherein all clock buses are on the same side of the phase electrode. This type of a serial CCD register is useful as a multiplexer or demultiplexer at the input or output of a serial-parallel-serial area array.

The same clock phase for adjacent bits in a three phase CCD are connected to every third phase electrode. The structure for applying the control signals from clock buses to the phase electrodes is closely related to space utilization on semiconductor chips. Where register length is limited by charge transfer efficiency, the use of three phase clocking allows serial registers to be thirty-three percent longer and serial-parallel-serial (SPS) registers to be seventy-eight percent longer than is possible with four phase systems. A reduced number of transfers per bit is especially important for analog memory application since the signal dispersion due to imperfect transfer cannot be simply removed by the use of the threshold detector-regenerator as in a digital system.

The present invention is directed to a CCD structure in which pairs of electrodes of the same clock phase in adjacent bits are first connected together to a single lead which connects each pair of electrodes to a clock bus. Such a configuration requires four interlevel contacts for each pair of bits or an average of two per bit. Transfer electrodes may then be located on the side of the phase electrodes opposite the clock buses in the form of a double level composite transfer electrode to permit serial to parallel or parallel to serial transfer.

In a more specific aspect, there is provided a dual layered series of transfer electrodes extending across the channel in a body of semiconductor material. Odd electrodes are located in the first level and even electrodes in the second level. The two levels are separated by an insulation layer. Three parallel phase buses are located on one side of the channel. Two of them are in one of the levels and one in the other of the levels. One conductive lead extends from each phase electrode to form a series of leads the successive members of which alternate between the levels. A conductive path is provided between each lead and one of the buses and includes a connection through vias in the insulation layer in a zone located between the channel and the clock buses. The connection then serves to parallel each given electrode with another electrode third in the series from the given electrode.

The novel features believed characteristic of the invention are set forth in the appended claims. The invention itself, however, as well as further objects and advantages thereof, will best be understood by reference to the following detailed description of an illustrative embodiment taken in conjunction with the accompanying drawings, in which:

Figure 1:
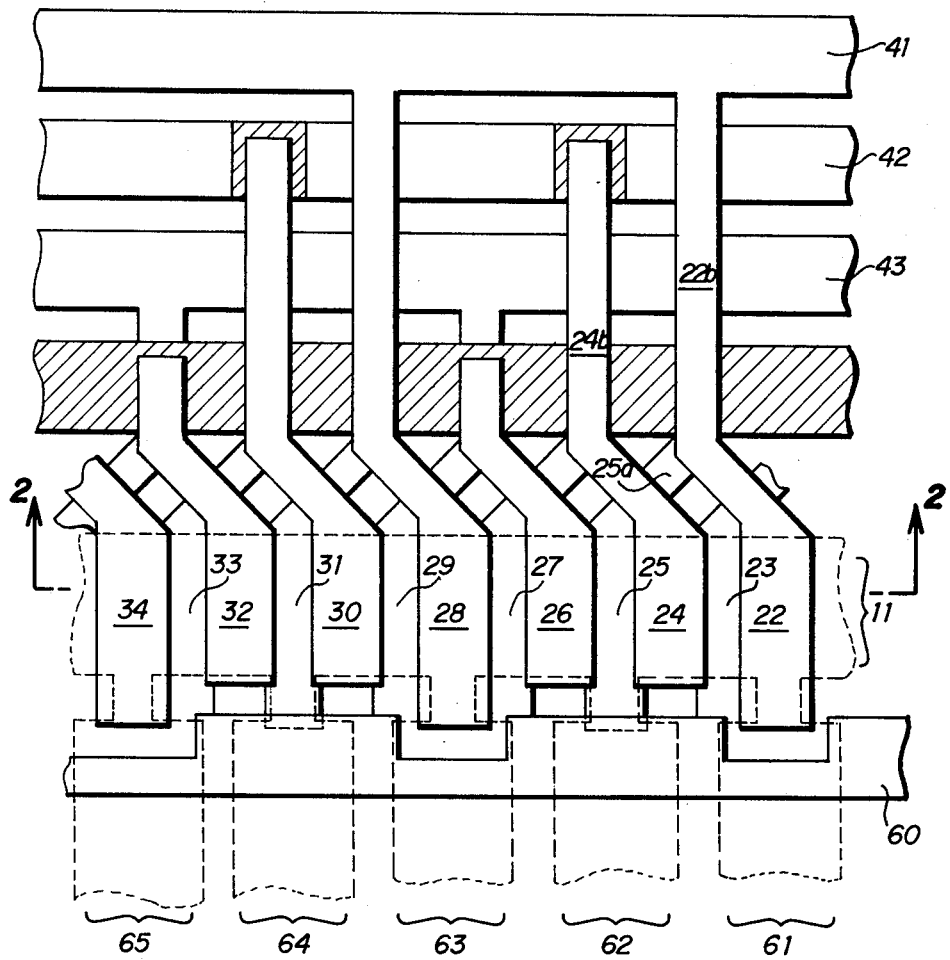
FIG. 1 is a view from above the surface of a CCD device embodying the bus-electrode connections of the present invention for a double level three phase CCD unit.
Figure 2:
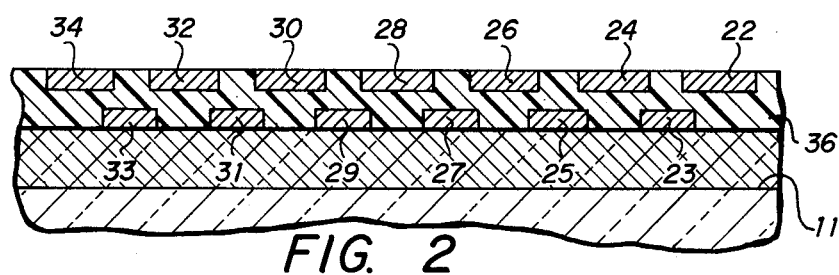
FIG. 2 is a sectional view taken along lines 2—2 of FIG. 1.

Referring to FIGS. 1–4, a CCD device embodying the present invention includes a semiconductor body 10 in which there is formed a channel 11 through which charge packets are to be transferred under the control of three phase voltage pulses applied to phase electrodes. More particularly, a semiconductor of the P-type is normally boron doped and then diffused along parallel strips with P+ boron to change the threshold level and thereby diffuse the boundaries of channel 11.

Serial channel 11 is positioned beneath two layers of parallel slightly overlapping phase electrodes. The phase electrodes in the order in which they appear in the drawings are electrodes 21–34. The electrodes 21, 23, 25, 27, 29, 31 and 33 are lower level electrodes. That is, they are on a level close to the surface of the body 10. Electrodes 22, 24, 26, 28, 30, 32, and 34 are upper level electrodes. That is, they are spaced from the lower level electrodes by an insulation layer 36, FIGS. 2 and 3. Also provided are three phase clock buses 41, 42 and 43. The buses are parallel to one another and are parallel to the boundary of the serial channel 11. Bus 41 is on the upper level in the same plane as electrodes 22, 24, 26, 28, 30, 32, and 34. The clock buses 42 and 43 are on the lower level in the same plane as electrodes 21, 23, 25, 27, 29, 31 and 33. In order to provide connections in the proper sequence from clocked buses 41–43 to the electrodes 21–34 and other electrodes that may be on the same structure, special provision is hereby provided wherein this is done in minimum space.

It is to be understood that the three buses 41, 42 and 43 carry the three different phase clock voltages that are to be applied to the electrodes 21–34. Electrode 22 is to be connected to bus 41. Electrode 22 is on the upper layer and thus can go directly to bus 41. However, lower layer electrode 25 also is to be connected to bus 41. Electrodes 24 and 27 are to be connected to bus 42. In a similar manner, electrodes 26 and 29 are to be connected to bus 43. The common phases of the buses and electrodes have been supplied the legends $\theta_1$, $\theta_2$ and $\theta_3$.

Figure 3:
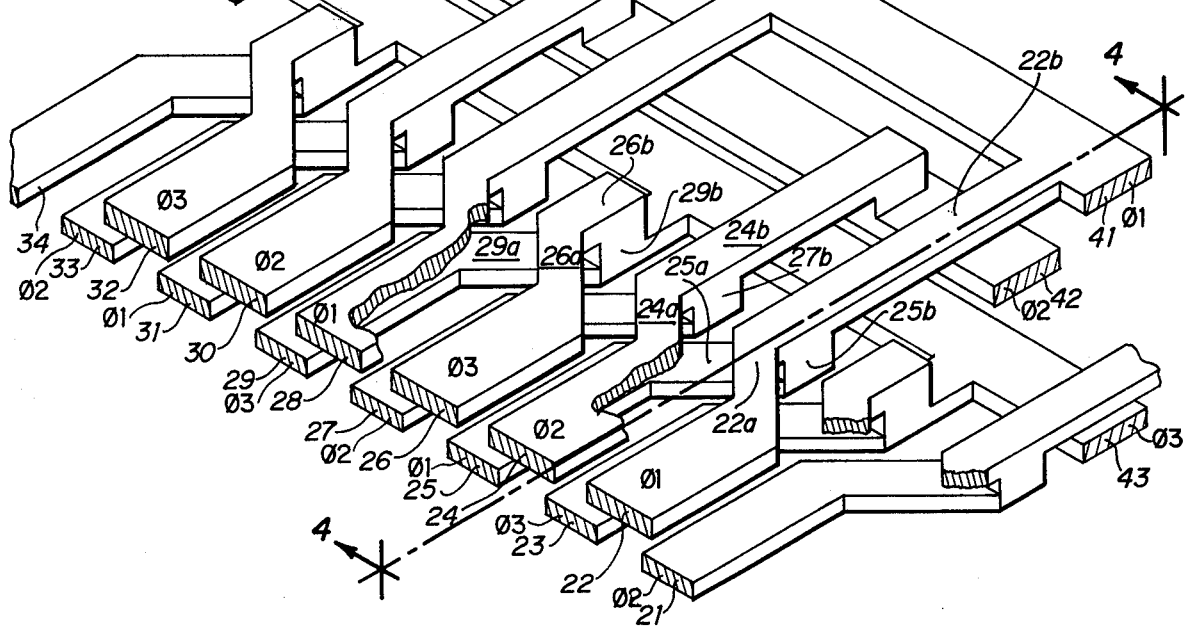
FIG. 3 is an isometric view of a segment of the system of FIG. 1.
Figure 4:
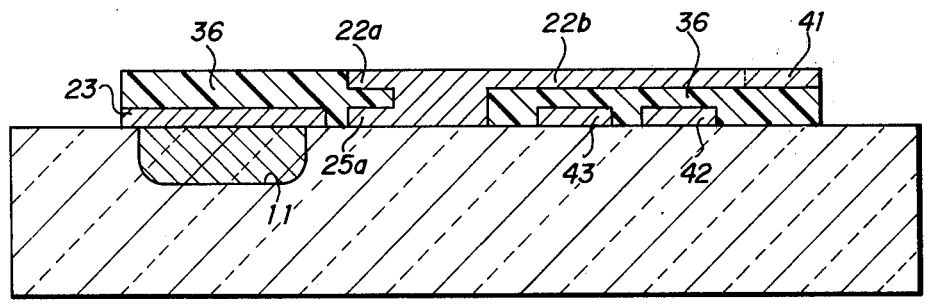
FIG. 4 is a sectional view taken along lines 4—4 of FIG. 3.

In accordance with the present invention, pair connections are made through vias in the insulation layer in a zone between the boundary of the serial channel 11 and clock bus 43. The vias permit interconnection between each given electrode and another electrode third in the series from the given electrode. As best shown in FIG. 3, the phase electrode 22 is connected to bus 41. Electrode 22 has a diagonal lead 22a extending therefrom which is connected to or integral with a lead portion 22b which extends parallel to electrode 22 and perpendicular to clock bus 41. The lead 22b thus makes a direct connection to the clock bus 41 all in the same plane or level. In contrast, lower electrode 25 has a diagonal lead section 25a which extends to a position under section 22b. A connection is then made in the zone 25b upward through a via in the insulation layer to connect to the section 22b. Thus, each upper layer $\theta_1$ electrode which is to be connected to clock bus 41 is connected in parallel with a lower layer electrode that is to be connected to the same bus 41.

In a further example, consider now the connection to the $\theta_3$ bus 43 of electrodes 26 and 29. Electrode 26 has diagonal section 26a and a parallel section 26b. The electrode 29 has diagonal section 29a extending under the section 26b. A section 29b extends upward through a vias to make connection to the section 26b and extends to and integral with the bus 43. The common connection from electrodes 24 and 27 has not been detailed. Electrodes 24 and 27 have been only partially shown in FIG. 3 in order to detail the two paths just described. However, the connection to bus 42 includes a conductive section 24a and a vias section 27b.

The structure above described permits the application of clock pulses to two layered, partially overlapping electrodes from one side of the serial channel. This is typically necessary for a serial register used as a multiplexer or demultiplexer. The same clock phase in adjacent bits are first connected together in pairs and then connected to a clock bus by means of a single lead. This requires four interlevel contacts for each pair of bits. The fact that three of these are adjacent permits increased density. An average of two interlevel contacts per bit of this system is one less than is required for comparable four phase double level systems.

It is now clear that in three phase overlapping gate structures, parallel transfer is complicated by the fact that the gates for a given phase appear alternately on first and second levels in successive cells of the register. If it is desired to effect the parallel transfer to or from phase three of the serial register, then the end of transfer electrode 60 adjacent the whole length of the serial register alternates between first and second levels in order to overlap phase three as required for efficient transfer. There is maintained a minimum separation between gates on the same metal level while minimizing the necessary overlap between metal levels and between metal and channel stops. The width of transfer electrode 60 is larger than in conventional SPS devices with single level metallization or with more conventional designs with four phase double level metallization. Thus, the present invention avoids the undesirable reduction in density and minimizes the distance in the direction of charge flow, thus increasing transfer efficiency in high speed operation.

More particularly, as shown in FIG. 1, serial-to-parallel transfer electrode 60 is provided on the side of the channel 11 opposite the three clock buses 41–43. Serial channel 11 is to feed parallel channels 61–65. Thus, electrodes 22, 25, 28, 31 and 34 extend to cover narrow outlets which interconnect channel 11 with channels 61–65. Transfer electrode 60 has a serrated upper level edge facing channel 11. When transfer gate 60 is held off, preventing transfer of charge from the serial channel 11 to channels 61–65, the perturbation of charge flow down the serial register caused by the cul-de-sac at each outlet forming a parallel transfer point is smaller where the phase three is on the top level. The effective size of the cul-de-sac is smaller by the amount of interlevel overlap.

Figure 5:
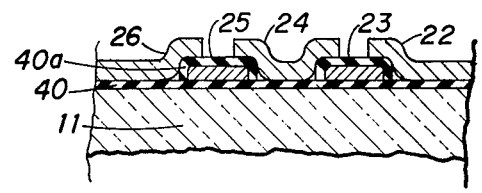
FIG. 5 is a sectional view illustrating structure detail.

While the system illustrated in FIGS. 1–4 has not referred to details of conventional CCD structure, FIG. 5 illustrates an insulating oxide layer 40 formed on the upper surface and electrodes 22–26 thereabove.

In FIGS. 1–4 series 22–34 of upper layer electrodes and series 22–33 of lower layer electrodes are illustrated as occupying two separate exclusive vertically spaced layers separated by insulating layer 36. However, use of known anodized aluminum fabrication methods results in the lower surfaces of electrodes of the upper layer at the same plane or level as the lower surfaces of the lower layer electrodes. This relationship has been illustrated to FIG. 5.

In forming the system of FIG. 5, the semiconductor body 10 is treated to form an oxide layer 40 following which the lower layer electrodes 23, 25, etc. are deposited and formed in conventional manner. Thereafter an oxide layer 40a is formed over the lower layer electrodes. Thereafter, the upper surface is metallized and the zones in between electrodes 22, 24 and 26 are etched away down to the layer 40a. As a result the upper layer electrodes actually overlap the boundaries of the lower layer electrode. At the same time the lower face of the upper layer electrodes is coplanar with the lower face of the lower layer electrodes.

Further, rather than use the arrangement of FIGS. 1–4, the mirror image of the system of FIGS. 1–4 may be found to be preferred. More particularly, in such case, the lead sections 22b and 24b as well as the bus 41 would be located on lower level and the buses 42 and 43 would be on upper level. Preference for such structure stems from the fact that wide buses 42 and 43 formed on the surface contour, i.e., over the top of the lead sections 22b and 24b and other first level leads are less likely to be open circuited. Wide buses (42, 43) formed on an uneven surface provide better step coverage that thin buses (22b, 24b) formed over an uneven surface.

Having described the invention in connection with certain specific embodiments thereof, it is to be understood that further modifications may now suggest themselves to those skilled in the art and it is intended to cover such modifications as fall within the scope of the appended claims.

What is claimed is:

1. In an n phase serial charge coupled device shift register where a set of phase buses extend parallel one to another at plural levels above the surface of a semiconductor body displaced from one side of a channel formed in said body, which comprises:
    a. an array of phase electrodes positioned in at least two levels above said channel in spanning relation thereto with adjacent electrodes in different levels and separated by an insulating layer,
    b. secondary bus means to interconnect one of said electrodes in one level to an electrode spaced n electrodes therefrom in said array in a different level by way of a via through said layer intermediate said buses and said one side with an extension to one of said buses.

2. The combination set forth in claim 1 in which n = 3.

3. The combination set forth in claim 2 in which two of said buses are at a lower level adjacent the surface of said body and the third bus is at an upper level.

4. The combination set forth in claim 3 in which said third bus is most remote from said channel.

5. The combination set forth in claim 4 in which said secondary bus means includes segments in at least two vias in each connection to the phase bus central to said set.

6. The combination set forth in claim 1 in which said phase electrodes overlap one another at margins transverse to said channel.

7. The combination set forth in claim 6, wherein non-overlapping portions of said phase electrodes are uniformly spaced from said surface of the semiconductor body.

8. The combination set forth in claim 2 in which said channel has outlets at every third electrode in said array leading to a set of parallel channels and in which a transfer electrode on two levels is interleaved with ends of electrodes of said array on two levels.

9. The combination set forth in claim 2 in which two of said buses are at an upper level and the third bus remote from said channel is at a lower level.

10. In a three phase serial charge coupled device shift register having a channel defined in a semiconductor body for movement therethrough of charge packets, the combination which comprises:
   a. a dual layered series of phase electrodes extending across said channel at the surface of said body with odd electrodes in a first level and even electrodes in a second level separated from said first level by an insulation layer,
   b. three parallel phase buses on one side of said channel two of which are on one of said levels and one of which is on the other of said levels,
   c. one conductive lead extending from each said electrode to form a series of leads the successive members of which alternate between said levels, and
   d. a conductive path between each electrode and one of said buses including a connection through vias in said insulation layer in a zone located between said channel and said buses said connection paralleling each given electrode to another electrode third in said series from said given electrode.

11. In a three phase serial charge coupled device shift register having a channel defined in a semiconductor body for movement therethrough of charge packets, the combination which comprises:
   a. a dual layered series of phase electrodes extending across said channel at the surface of said body with odd electrodes in a first level and even electrodes in a second level separated from said first level by an insulation layer,
   b. three parallel phase buses on one side of said channel two of which are on one of said levels and one of which is on the other of said levels, and
   c. conductive structures leading to said buses each connecting phase electrodes of like phase in pairs through vias in a zone between the phase electrodes and the phase buses.

12. In an n-phase serial charge coupled device shift register which a set of phase buses extend parallel to each other at plural levels above the surface of a semiconductor body displaced from one side of a channel formed in said body, the combination which comprises:
   a. an array of phase electrodes positioned in at least two levels above said channel in spanning relation thereto with adjacent electrodes in different levels electrically isolated from each other by an insulating layer;
   b. each said phase electrode having an integral inclined conductor at one end thereof, the inclined conductors at one of said two levels all inclined in one direction, and the inclined conductors at the other of said two levels all inclined in an opposite direction, at least one transverse extension from each phase bus connected by respective ones of said inclined conductors with a phase electrode at one of said two levels and with a phase electrode spaced $n$ electrodes therefrom at the other of said two levels, such that the inclined conductors connected with any particular said transverse extension together define a generally Y-shaped structure.

13. The combination set forth in claim 12, wherein $n = 3$, said phase electrodes have the same width, extend parallel to each other and overlap each other at margins transverse to said channel, and wherein the non-overlapping portions of all said phase electrodes are equidistant from said semiconductor surface.

14. The combination set forth in claim 12, wherein said phase buses, phase electrodes, inclined conductors and transverse extensions comprise aluminum and wherein said insulating layer comprises anodized aluminum.

* * * * *